(12) United States Patent
Handy et al.

(10) Patent No.: US 10,498,130 B2
(45) Date of Patent: Dec. 3, 2019

(54) METHOD FOR LIMITING CURRENT IN A CIRCUIT

(71) Applicant: GE Aviation Systems Limited, Cheltenham, Gloucestershire (GB)

(72) Inventors: Peter James Handy, Cheltenham (GB); Julian Peter Mayes, Cheltenham (GB); David Alan Elliott, Cheltenham (GB)

(73) Assignee: GE Aviation Systems Limited, Cheltenham, Gloucestershi (GB)

( * ) Notice: Subject to any disclaimer, the term of this patent is extended or adjusted under 35 U.S.C. 154(b) by 112 days.

(21) Appl. No.: 15/238,803

(22) Filed: Aug. 17, 2016

(65) Prior Publication Data

US 2016/0359311 A1      Dec. 8, 2016

Related U.S. Application Data

(63) Continuation-in-part of application No. PCT/GB2014/050465, filed on Feb. 18, 2014, and a
(Continued)

(51) Int. Cl.
*H02H 3/02* (2006.01)
*H02H 9/02* (2006.01)
(Continued)

(52) U.S. Cl.
CPC ............ *H02H 3/025* (2013.01); *H02H 9/025* (2013.01); *G01R 31/086* (2013.01); *H01H 9/541* (2013.01);
(Continued)

(58) Field of Classification Search
USPC .............................................. 361/2–8, 86–87
See application file for complete search history.

(56) References Cited

U.S. PATENT DOCUMENTS

| 4,740,883 A | 4/1988 | McCollum et al. |
| 5,550,702 A | 8/1996 | Schmidt et al. |

(Continued)

FOREIGN PATENT DOCUMENTS

| DE | 10357250 A1 | 7/2005 |
| EP | 1150410 A2 | 10/2001 |

(Continued)

OTHER PUBLICATIONS

International Search Report and Written Opinion issued in connection with corresponding PCT application PCT/GB2014/050465 dated Oct. 22, 2014.
(Continued)

*Primary Examiner* — Danny Nguyen
(74) *Attorney, Agent, or Firm* — GE Aviation Systems Limited; William Andes

(57) ABSTRACT

Method(s) for limiting current in an electrical circuit having transmission wires for power transmission include determining whether an unexpected operating condition exists along the transmission wires and limiting the current to prevent (damage caused by) the unexpected operating condition. The method may further include disabling the electrical circuit if the unexpected operating condition persists. Additionally, a system includes a power source, a solid state power controller (SSPC) configured to operate in a first conducting state and a second non-conducing state, and a controller.

18 Claims, 6 Drawing Sheets

Related U.S. Application Data continuation-in-part of application No. PCT/GB2014/050466, filed on Feb. 18, 2014.

(51) Int. Cl.
  *H02H 3/08* (2006.01)
  *G01R 31/08* (2006.01)
  *H02H 7/122* (2006.01)
  *H01H 9/54* (2006.01)

(52) U.S. Cl.
  CPC ............ *H01H 9/542* (2013.01); *H02H 3/08* (2013.01); *H02H 7/1227* (2013.01)

(56) References Cited

U.S. PATENT DOCUMENTS

| | | | |
|---|---|---|---|
| 5,723,915 | A | 3/1998 | Maher et al. |
| 8,390,151 | B2 | 3/2013 | Rozman et al. |
| 2007/0103833 | A1 | 5/2007 | Harris |
| 2010/0328831 | A1 | 12/2010 | Zhang |
| 2011/0221404 | A1* | 9/2011 | Rozman ............ H02J 1/08 323/234 |
| 2011/0299201 | A1* | 12/2011 | Rozman ............ H02H 1/0015 361/42 |
| 2011/0304942 | A1 | 12/2011 | Rozman et al. |
| 2011/0309809 | A1* | 12/2011 | Rao ............ H02H 9/001 323/282 |
| 2013/0050890 | A1 | 2/2013 | Rozman et al. |

FOREIGN PATENT DOCUMENTS

| | | |
|---|---|---|
| EP | 2388917 A2 | 11/2011 |
| EP | 2398146 A2 | 12/2011 |
| EP | 2562893 A2 | 2/2013 |
| GB | 2478945 A | 9/2011 |

OTHER PUBLICATIONS

International Search Report and Written Opinion issued in connection with corresponding PCT application PCT/GB2014/050466 dated Aug. 26, 2014.

* cited by examiner

METHOD FOR LIMITING CURRENT IN A CIRCUIT

CROSS-REFERENCE TO RELATED APPLICATIONS

This application is a continuation-in-part of International Application No. PCT/GB14/050465, with an international filing date of Feb. 18, 2014. This application also is a continuation-in-part of International Application No. PCT/GB14/050466, with an international filing date of Feb. 18, 2014. Both of the aforementioned applications are hereby incorporated by reference in their entireties.

BACKGROUND

Electrical systems, such as those found in an aircraft power distribution system, employ electrical bus bars and miles of wiring for delivering power from electrical power sources to electrical loads. In the event of an unexpected electrical condition or electrical fault, high currents may be shorted or transmitted (e.g., through a normally nonconductive medium, such as air), resulting in unexpected operations of the power distribution system.

BRIEF DESCRIPTION

In an embodiment, a method is provided for limiting current in a circuit having a power source electrically coupled with a solid state power controller (SSPC). The SSPC is configured to operate in a first conducting state and a second non-conducting state, and is further coupled with an electrical load via a transmission wire having an inductance. The circuit further includes a flywheel diode configured across the transmission wire. The method includes a first sensing of a current along the transmission wire while the SSPC is operated in the first conducting state, determining when the first sensing of the current satisfies a first current threshold, reducing the power transmission along the transmission wire by operating the SSPC in the second non-conducting state and allowing electrical energy stored in the inductance to generate current through the flywheel diode, a second sensing of a current along the transmission wire, determining if the second sensing of the current satisfies a second current threshold, and increasing the power transmission along the transmission wire by operating the SSPC in the first conducting state.

In an embodiment, a method for limiting current in a circuit having a power source electrically coupled with an SSPC is disclosed. The SSPC is configured to operate in a first conducting state and a second non-conducting state and is further coupled with an electrical load via a transmission wire. The method includes a sensing of a current along the transmission wire, comparing the sensing of the current to a current profile, determining a pulse width modulation (PWM) duty cycle for operating the SSPC in the first state and second state based on the comparison, and operating the SSPC according to the duty cycle.

DETAILED DESCRIPTION

The described embodiments are directed to an electrical power distribution system, which may be used, for example, in an aircraft. While this description is primarily directed toward a power distribution system for an aircraft, it is also applicable to any environment using an electrical system for transmitting power from a power source to an electrical load.

Figure 1:
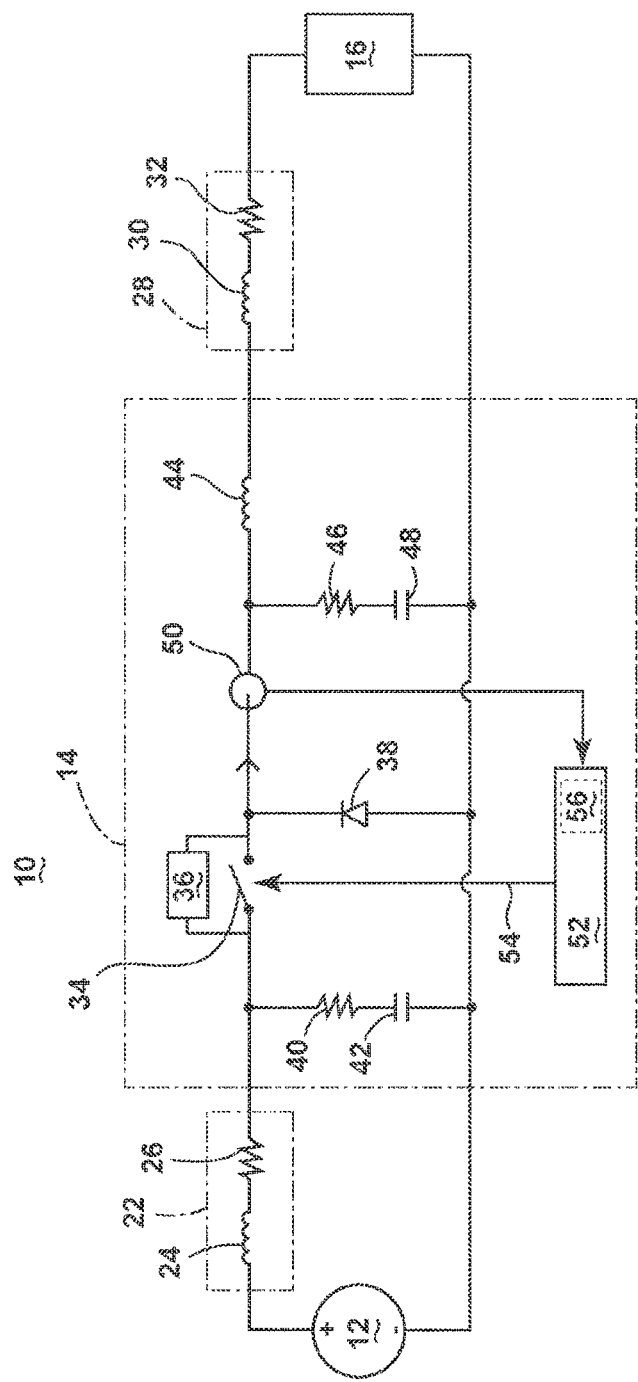
FIG. 1 is a schematic circuit diagram of a power distribution system in accordance with one embodiment.

FIG. 1 illustrates an exemplary schematic circuit diagram of a power distribution system 10, such as an exemplary power distribution system in an aircraft, including a power source, for example, a generator 12, an electrical switch, such as a solid state power switch (SSPC) 14, and an electrical load 16. As shown, the power distribution system 10 further includes electrical interconnects, cables, cable junctions, or bus bars, illustrated as a first electrical transmission wire 22 electrically coupling the generator 12 with the SSPC 14, and a second electrical transmission wire 28 electrically coupling the SSPC 14 with the electrical load 16. As shown, the first transmission wire 22 and/or the generator 12 may define a variable or predetermined first set of electrical characteristics upstream from the SSPC 14, for example, a first inductance 24 and first resistance 26. Likewise, the second transmission wire 28 may define a variable or predetermined second set of electrical characteristics, for example, a second inductance 30 and a second resistance 32.

The SSPC 14 may include a controllable switching component 34, a transient-voltage-suppression device configured across the switching component 34, such as a transorb 36, and a diode, such as a flywheel diode 38, biased from, for example, electrical ground to the power line, downstream from the switching component 34. As shown, the power distribution system 10 may also include a third resistance 40 and a first capacitance 42 configured upstream from the switching component 34 and across the first transmission wire 22 input, a third inductance 44 downstream from the switching component 34, and a fourth resistance 46 and a second capacitance 48 configured downstream from the switching component 34 and across the second transmission wire 28 output. The SSPC 14 may further include a current sensor 50 positioned downstream from the switching component 34 and flywheel diode 38, and capable of sensing and/or measuring the electrical current characteristics of the current flowing through the power distribution system 10. In an embodiment, the switching component 34 is controllable to operate in an open (non-conducting) state that prevents electrical transmission via the switching component 34, and a closed (conducting) state that allows electrical transmission via the switching component 34.

One example of the SSPC 14 may include a silicon carbide (SiC) or Gallium Nitride (GaN) based, high bandwidth power switch. SiC or GaN may be selected based on their solid state material construction, their ability to handle large power levels in smaller and lighter form factors, and their high speed switching ability to perform electrical operations very quickly.

In an embodiment, the switching component 34 of the SSPC 14 includes a field-effect transistor (FET). Additionally, while a transorb 36 is described, any transient-voltage-suppression devices may be used which, for example, allowing current to flow from upstream of the switching component 34 to downstream of the switching component 34, when exposed to a transient voltage greater than a breakdown voltage for the transorb 36. In an embodiment, the breakdown voltage for the transorb 36 is less than the voltage generated by the generator 12. Example current characteristics measurable by the current sensor 50 may include, but are not limited to, instantaneous current, average current, or rate of change in current. While the current sensor 50 is illustrated measuring the current characteristics at the SSPC 14, other measurement locations are possible so long as the measurements are captured downstream from the switching component 34 and flywheel diode 38. While the current sensor 50 is described as "sensing" and/or "measuring" the electrical current of the power distribution system 10, in an embodiment, the sensing and/or measuring may include the determination of a value indicative or related to the electrical current characteristics, and not the actual current values.

The SSPC 14 may further include a controller 52 having an input to receive the sensed current measurement from the current sensor 50, and capable of generating and providing a control signal 54 output to the switching component 34. The controller 52 may additionally include memory 56, the memory 56 may include random access memory (RAM), read-only memory (ROM), flash memory, or one or more different types of portable electronic memory, such as discs, DVDs, CD-ROMs, etc., or any suitable combination of these types of memory. The controller 52 may be operably coupled with the memory 56 such that any suitable controller programs or computational code which may be stored in the memory 56 may be executed on the controller 52. In an embodiment, the control signal 54 is capable of controlling the switching component 34, and thus, controlling the operation of the SSPC 14.

While the controller 52 is illustrated as a subcomponent of the SSPC 14, alternative configurations are possible wherein the controller 52 may provide control of the SSPC 14 from a remote location. For example, one controller 52, provided away from the SSPC 14, may be configured to provide control for one or more SSPCs 14 or sets of SSPCs 14. Furthermore, in an embodiment, the memory 56 may be separate from the controller 52, but may be in communication with the controller 52 such that it may be accessed by the controller 52. For example, in an embodiment, the suitable controller programs stored in the memory 56 may be updated through the wireless communication link, or from a common memory storage system.

During operation, in an aircraft embodiment for example, an operating gas turbine engine may provide mechanical energy to provide a driving force for the generator 12, which outputs electricity in response. The generator 12, in turn, provides the generated power to the SSPC 14 via the first transmission wire 22, which in turn, is controllable by the controller 52 to deliver the power to the electrical loads 16, via the second transmission wire 28. Additional power sources for providing power to the electrical loads 16 may be used, such as emergency power sources, ram air turbine systems, starter/generators, Auxiliary Power Units (APUs), fuel cells, or batteries. It will be understood that while one embodiment is described in an aircraft environment, the scope is not so limited and other embodiments have general application to electrical power systems in non-aircraft applications, such as other mobile applications and non-mobile industrial, commercial, and residential applications.

Figure 2:
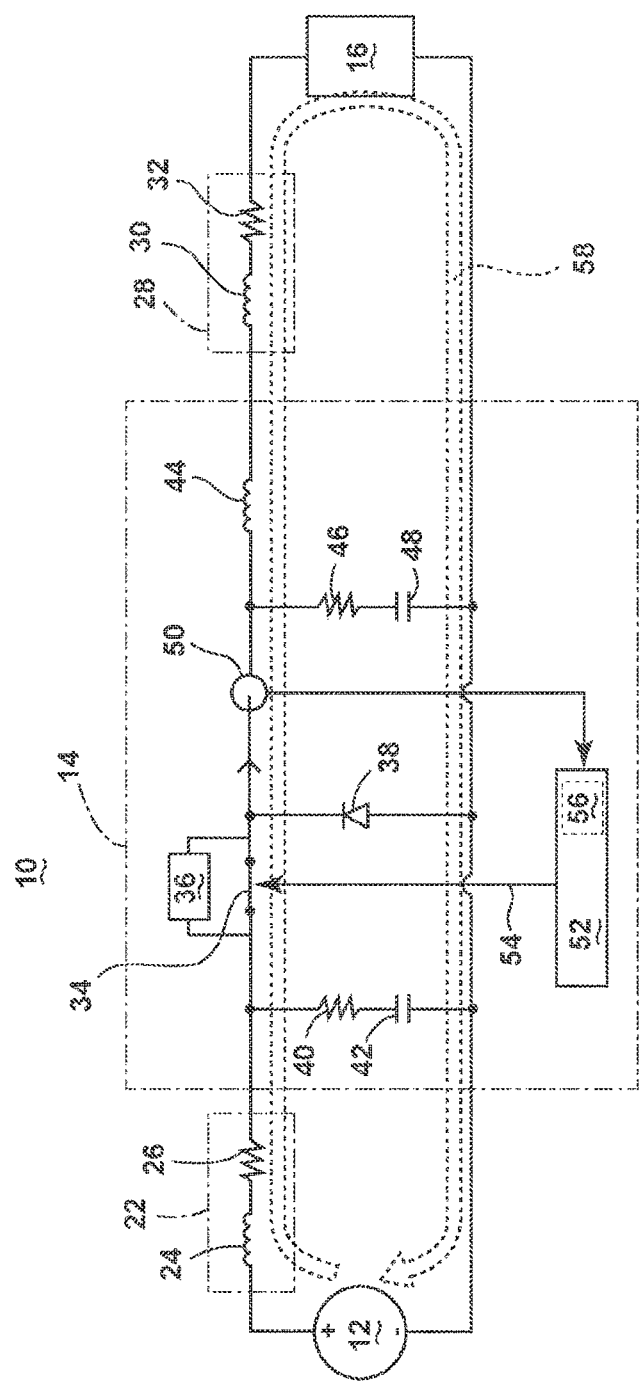
FIG. 2 is a schematic circuit diagram of the power distribution system illustrating current flow of the system when the switchable component is closed, in accordance with the first embodiment.

FIG. 2 illustrates operation of the power distribution system 10 when the controller 52 controls the switching component 34 to operate in a closed state. In this illustration, a first current flow, shown as an arrow 58, shows the current flowing from the generator 12, through the first transmission wire 22, through the SSPC 14 (via the switching component 34 in a closed state), through the second transmission wire 28, to the electrical load 16, and back to the generator 12 along the closed circuit.

Figure 3:
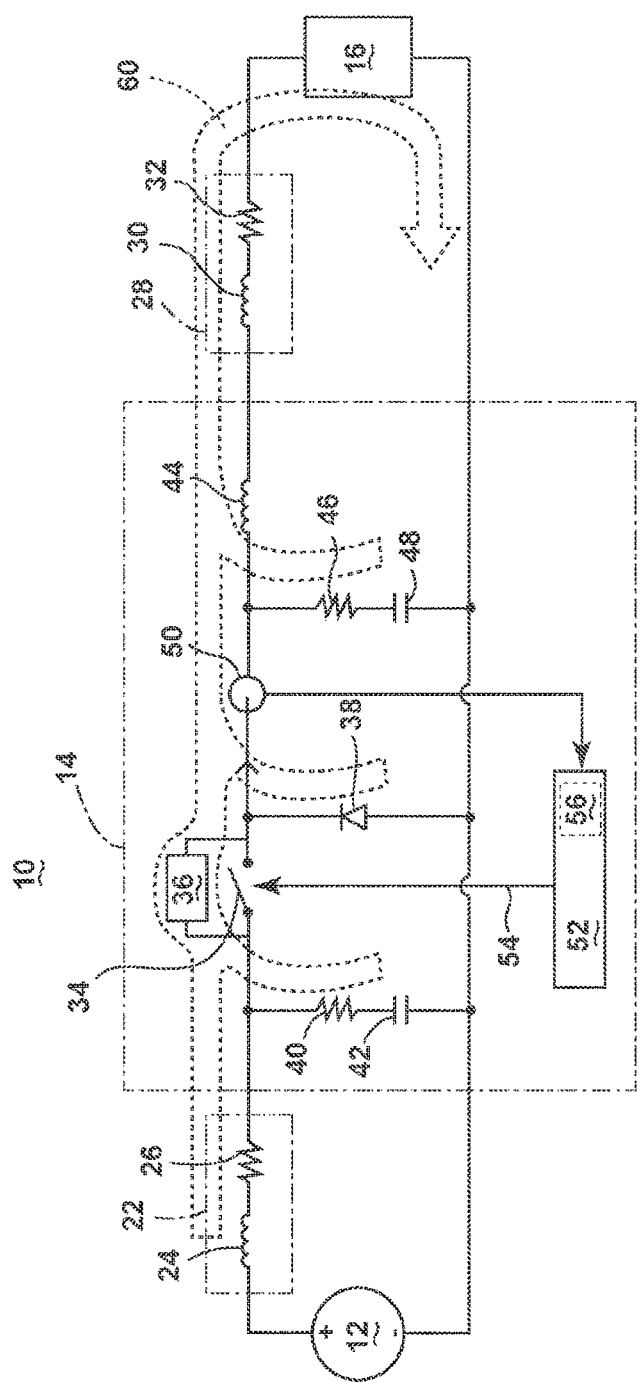
FIG. 3 is a schematic circuit diagram of the power distribution system illustrating current flow of the system at the instance the switchable component is opened, in accordance with the first embodiment.

FIG. 3, alternatively, illustrates operation of the power distribution system 10 at the instantaneous time when the controller 52 controls the switching component 34 to toggle to an open state. This illustration demonstrates a second current flow, shown as a summation of arrows 60, and may include of current stored in the electric field of the second capacitance 48 and current stored in the magnetic fields of the second inductance 30 and third inductance 44, as each respective inductance attempts to resist the change in current caused by the toggling of the switching component 34 to an open state. The second current flow 60 may additionally include of current stored in the electric field of the first capacitance 42, and first inductance 24, the current traversing around the switching component 34, through the transorb 36, so long as voltage difference across the transorb 36 is greater than the transorb 36 breakdown voltage. Any current of the second current flow 60 completes a closed circuit through the flywheel diode 38 downstream of the switching component 34 in an open state. In an embodiment, at the instantaneous time when the controller 52 toggles the switching component to an open state, the second current flow 60 generated by any of the first, second, and third inductances 24, 30, 44, and any of the first or second capacitances 42, 48, will decay over time. If the switching component 34 is left in the open state for a long enough period of time, the second current flow will decay until no current flows in the power distribution system.

During operation of the power distribution system 10, unexpectedly high currents travelling through at least one of the transmission wires 22, 28, SSPC 14, and/or switching component 34 may cause system 10 failure or an over-temperature condition in the system 10. One non-limiting example of an unexpectedly high current, or "over-current" condition, may be two to three times the maximum expected current for the system 10. Higher over-current conditions and/or limits are possible.

Over-current conditions may occur due to electrical arcing or electrical shorts in an environment where, for example, physical defects in an electrical connection cause a permanent or temporary loss in transmission capabilities, or a sudden transmission of high levels of current. While electrical arcing and/or electrical shorts are described, additional causes of over-current conditions may occur, such as lightning strikes, current rush during starting conditions, etc.

A method for operating the power distribution system 10 to limit the transmission of current through the system 10 is described herein. First, the current sensor 50 provides a first sensing of current along the second transmission wire 28 of the system 10 under normal operation (i.e. the switching component 34 in a closed state), and this first sensing of current is provided to the controller 52. In an embodiment, the current sensor 50 may, for example, provide the first sensing of current at timed increments, continuously, or when polled by the controller 52.

The controller 52 then determines if the first sensing of the current satisfies a first current threshold. This determination may, for example, compare the first sensed current against a first current threshold indicative of an over-current condition. In an embodiment, the first current threshold may be predetermined and stored in the memory 56 of the controller 52, or for example, may be a current threshold relative to normal operating conditions, an absolute current value, or a percentage of the switch rating, for example, such as two hundred percent higher than the last 2 seconds average current. Alternative first current thresholds are possible, such as a first current threshold indicative of, or related to, a predetermined, relative, or estimated first thermal threshold of the switching component 34 or SSPC 14, for instance, a maximum operating temperature of the FET.

Based upon a determination that the first sensing of the current satisfies the first current threshold, for instance, if the first sensed current is greater than the first current threshold, the controller 52 provides a control signal 54 to the switching component 34 to control the component 34 to operate in an open state. By operating the switching component 34 in the open, non-conducting state, the power transmission along the transmission wires 22, 28 is reduced to only the current flow explained above and indicated by arrow 60.

Next, the current sensor 50 provides a second sensing along the second transmission wire 28 while the power distribution system 10 is under the reduced power transmission operation, and this second sensing is provided to the controller 52. In an embodiment, the current sensor 50 may, for example, provide the second sensing of current at timed increment or increments after the first sensing, continuously, or when polled by the controller 52.

The controller 52 then determines if the second sensing of the current satisfies a second current threshold. This determination may, for example, compare the second sensed current against a second current threshold indicative that the over-current condition has been relieved or removed. Stated another way, the determination may determine that the over-current condition no longer exists in the power distribution system 10. This determination may be indicated by, for example, a second sensed current is less than the second current threshold. In an embodiment, the second current threshold may also be predetermined and stored in the memory 56 of the controller 52, or in another example, may be a current threshold relative to normal operating conditions, such as fifty percent of rated current or an absolute current value, or a percentage of a rated current or absolute current value over a period of time, such as the last 2 seconds average current.

Alternative second current thresholds are possible, such as a second current threshold indicative of, or related to, a predetermined, relative, or estimated second thermal threshold of the switching component 34 or SSPC 14. One non-limiting example of a second thermal threshold of the switching component 34 may include a temperature below which the FET will operate as expected, or such that the FET is satisfactorily cooled after an over-temperature or over-current condition.

If the controller 52 determines that the second sensing of current satisfies the second current threshold, the controller 52 provides a control signal 54 to the switching component 34 to control the component 52 to operate in the closed, conducting state.

In an embodiment, the above-mentioned steps may occur repeatedly until the unexpectedly high currents are no longer present in the power distribution system 10, or until the controller 52 controls the switching component 34 of the SSPC 14 to operate in a non-conducting state due to the heating of switch 34. For example, the controller 52 may count the number of repetitions of the above-mentioned steps, or count the number of repetitions for a given period of time, such as a moving time window of the last two seconds. The controller 52 may further compare the number of repetitions with power distribution system 10 failure threshold or a predetermined number of repetitions. For example, five or ten repetitions may satisfy a system 10 failure threshold such that the controller 52 may determine that the failures are likely to continue to occur, or for example, that a arcing fault or electrical short exists in the system 10. Alternatively, the controller 52 may determine that a number of successive repetitions in the moving time window may satisfy the system 10 failure threshold. In any of these scenarios, the controller 52 may disable the power distribution system 10, temporarily or permanently, until the failure can be addressed, for example, by maintenance personnel. Alternative system 10 failure thresholds, or counting of repetitions indicative of failures, may occur.

While only a single generator 12, SSPC 14, first transmission wire 22, second transmission wire 28, electrical load 16, and controller 52 are illustrated for ease of understanding, alternate power distribution systems 10 are possible having one or more of the aforementioned components 12, 16, 22, 28, 14, 52 configured to define a robust power distribution system 10, or network of systems 10. For example, alternative configurations are possible having more than one electrical load 16 coupled to each SSPC 14, more than one set of transmission wires 22, 28 configured in series or parallel, or more than one SSPC 14 configured to selectively couple multiple sets of transmission wires 22 to additional portions of the power distribution system 10. Additionally, embodiments are possible wherein, for example, one controller 52 remotely controls operation of a plurality of SSPCs 14.

Furthermore, in an embodiment, the first set of electrical characteristics, the second set of electrical characteristics, and the third inductance are selected such that the desired power transmission response, or electrical responses of the power distribution system 10, may be designed to, for example, operate without power interruption during the method, or such that the method operates faster than the reset time for the electrical load. Additionally, the third inductance 44 may be an inherent inductance defined by the SSPC 14, or it may be designed to be at least a minimal inductance, as needed, to generate a minimal current, as needed, when the switching component 34 is opened. In another instance, the third inductance 44 is optional where the second inductance 30 is capable of maintaining a minimal current, as designed, when the switching component 34 is opened.

Figure 4:
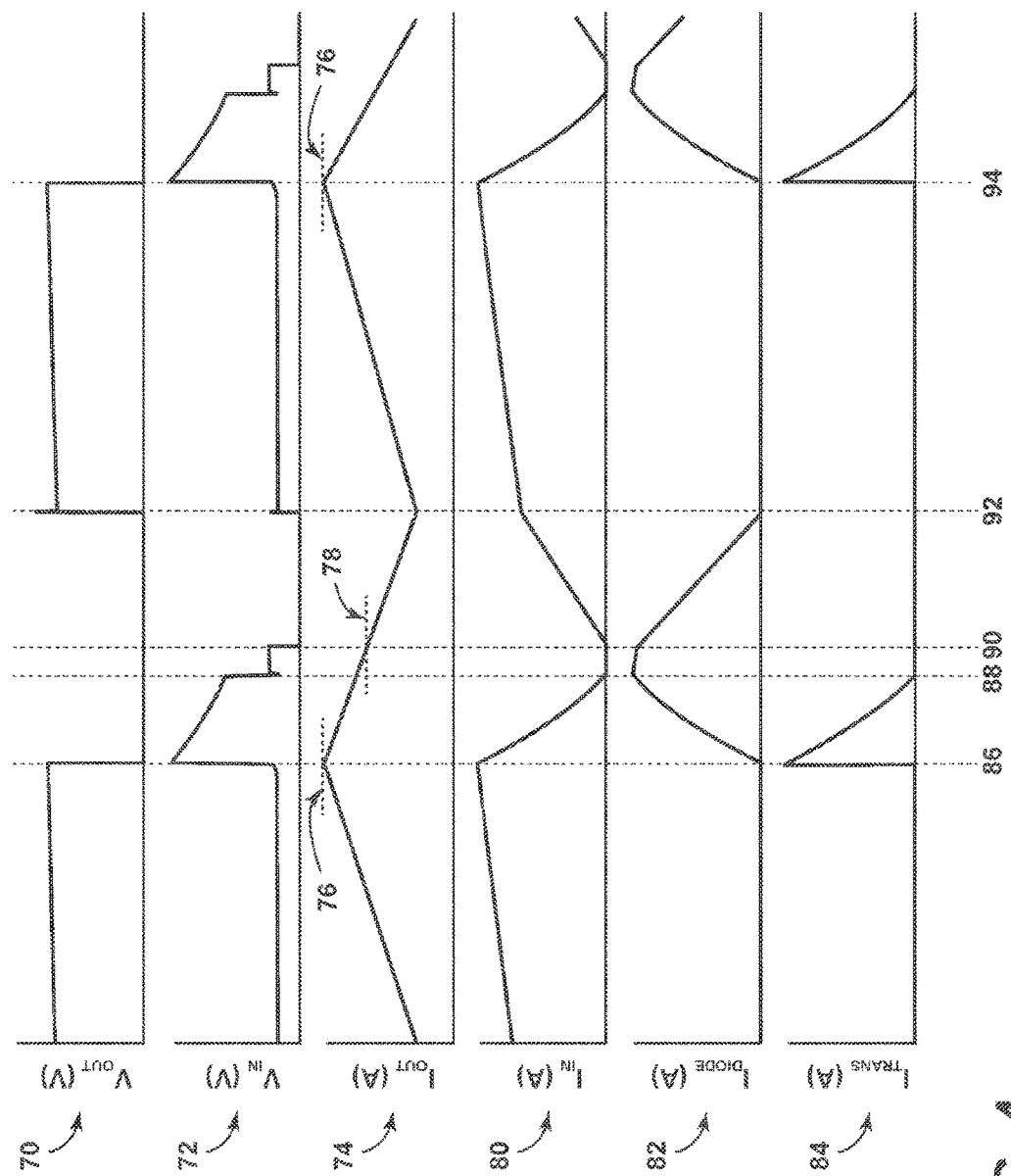
FIG. 4 is a series of graphs showing the response of the power distribution system, in accordance with the first embodiment.

One embodiment of the power distribution system 10 operation may be further understood with reference to the time-aligned graphs presented in FIG. 4. As illustrated, a first graph 70 showing an example voltage on the second transmission wire 28 ("voltage out"), a second graph 72 showing an example voltage at the upstream location of the transorb 36 ("voltage in"), a third graph 74 showing an example current signal relative to the first current threshold 76 and second current threshold 78, as measured by the current sensor 50 ("current out"), a fourth graph 80 showing an example current at the upstream location of the transorb 36 ("current in"), a fifth graph 82 showing an example current across the flywheel diode 38 ("diode current"), and a sixth graph 84 showing an example current across the transorb 36 ("transorb current"). The graphs 70, 72, 74, 80, 82, 84 additionally illustrate sequentially corresponding time values of a first time instance 86, and a second time instance 88, a third time instance 90, a fourth time instance 92, and a fifth time instance 94. It is understood that the first, second, third, fourth, fifth, and sixth graphs 70, 72, 74, 80, 82, 84 are intended for illustrative purposes demonstrating the power distribution system 10 responses, as described, and are not meant to accurately represent voltage, current, or timing aspects.

At the start of the method, the power distribution system 10 is operating with the switching component in a closed conducting state. At this time, the voltage in and voltage out are positive, as is the current in and the current out. Also shown, there is no diode current in the fifth graph 82, nor is there transorb current in the sixth graph 84 (due to current through the switching component in a closed state). However, as illustrated, voltage out is rising in the first graph 70, the current out is rising in the third graph 74, and the current in is rising in the fourth graph 80.

At the first time instance 86 the current out satisfies the first current threshold 76, as shown in the third graph 74. When this occurs, the switching component 34 is toggled to an open state. Between the first time instance 86 and the second time instance 88, the voltage out in the first graph 70 goes to zero. Additionally, between these time instances 86, 88, the voltage in of the second graph 72 jumps up, as the first inductance 24 attempts to dissipate its stored energy, until the transorb 36 starts to conduct current, as shown in the sixth graph 84. The transorb current in the sixth graph 84 also corresponds to the current in shown in the fourth graph 80, as all current in is traversing via the transorb 36 in this period.

Likewise, the second and third inductances 30, 44 dissipate their stored energy through the circuit. In this sense the first, second, and third inductors 24, 30, 44 are selected in order to provide a minimal amount of current, as needed, after the switching component 34 has been toggled to an open state. In this sense, while the inductors 24, 30, 44 attempt to provide a minimal amount of current, the current out, as shown in the third graph 74, is reduced below the previous current levels (prior to opening the switchable component 34), and will continue to reduce as the inductors 24, 30, 44 continue to dissipate their stored energy. During this period, as current flows through and into the components downstream of the switching component 34, the current out completes a loop via the only remaining closed circuit via the flywheel diode 38. As shown in the fifth graph 82, the diode current increases as long as the current in flows.

Additionally, between the first time instance 86 and the second time instance 88, the transorb current of the sixth graph 84, and correspondingly the current in of the fourth graph 80, decay as the first inductance 24 dissipates its stored energy. At the second time instance 88, the transorb current of the sixth graph 84, and correspondingly the current in of the fourth graph 80, have decayed to zero.

Between the second time instance 88 and the third time instance 90, current is still flowing via the closed downstream loop, as represented by the diode current in the fifth graph 82 and the current out in the third graph 74. The diode current is shown falling due to the resistive losses of, for example, the second resistance 32 and load 16.

At the third time instance 90, the current out satisfies the second current threshold 78, as shown in the third graph 74. When this occurs, the switching component 34 is toggled to a closed state. With the generator 12 returned to the conducting loop, the current in begins to rise between the third time instance 90 and the fourth time instance 92, as shown in the fourth graph 80, as the first inductor 24 is charged. Additionally, the diode current in the fifth graph 82 drops as the first current flow 58 becomes available. During this time the current out continues to fall until the diode current falls to zero and the inductor 24 is charged.

At the fourth time instance 92, the diode current falls to zero in the fifth graph 82, and thus, the current out of the third graph 74 begins to increase again as the voltage out and voltage in, respectively of the first and second graphs 70, 72, return to their expected line voltages. As illustrated, between the fourth time instance 92 and the fifth time instance 94, the voltage out is again shown rising in the first graph 70, the current out is again shown rising in the third graph 74, and the current in is again shown rising in the fourth graph 80, until the current out in the third graph 74 again reaches the first current threshold 76, repeating the switching cycle.

Alternative power distribution system 10 responses are possible. For instance, if the current out of the third graph 74 satisfies the second current threshold 78 prior to the transorb current of the sixth graph 84 decaying to zero, the period between the second time instance 88 and the third time instance 90 may not need to be represented, and correspondingly, the period between the third time instance 90 and fourth time instance 92 may be reduced as the inductors 24, 30, 44 may not need to be charged for as long.

In an embodiment, a system includes a power source, and a solid state power controller (SSPC) configured to operate in a first conducting state and a second non-conducting state. The SSPC is electrically coupled with the power source, and is also electrically coupled with an electrical load via a transmission wire having an inductance. The system additionally includes a flywheel diode coupled across the transmission wire, and a controller (e.g., having one or more processors), which may be part of the SSPC or separate therefrom. The controller is configured (e.g., by way of non-transiently stored program instructions in memory) to determine when a first sensing of a current (e.g., by a current sensor) along the transmission wire, while the SSPC is operated in the first conducting state, satisfies a first current threshold; reduce a power transmission along the transmission wire by operating the SSPC in the second non-conducting state and allowing electrical energy stored in the inductance to generate current through the flywheel diode; determine if a second sensing of a current along the transmission wire satisfies a second current threshold; and increase the power transmission along the transmission wire by operating the SSPC in the first conducting state.

Many other possible embodiments and configurations in addition to that shown in the above figures are discussed in the present disclosure. Additionally, the design and placement of the various components may be rearranged such that a number of different in-line configurations could be realized.

A potentially beneficial effect of the embodiments is a method for limiting current in a circuit. One potential benefit that may be realized in the above embodiments is that the above described embodiments provide for reducing system current in response to an over-current condition, which may limit the over-current condition to a limited time. Over-current conditions may be indicative of a parallel or arcing fault in the system, which may generate intense localized heat from resistive losses at the fault, which could further lead to an electrical fire, smoke, melting of or damage to components, or catastrophic failures of the electrical system or greater structure, such as an aircraft. Thus, by limiting the current in the system, and correspondingly, limiting the time the system is operating in an over-current condition, the likelihood of thermal runaway due to a fault is reduced.

Another potential benefit of the above-described embodiments is the method allows for detection and prevention of an over-temperature condition at the switching component of the SSPC, which is likely to be a point of thermal failure during an over-current or over-temperature condition. The method thus allows for increased protection of the switching component and SSPC due to the current limiting technique described above. Furthermore, the above-described method may be applied to a plurality of SSPCs to ensure thermal failure protection across each of the SSPCs, or if failure occurs, further protection from thermal damage, electrical fire, smoke, etc. due to the disabling of the SSPC.

Yet another potential benefit of the above-described embodiments is by repeating the method a number of times prior to disabling the circuit, the method is capable of validating a persistent over-current or over-temperature condition as opposed to a temporary condition, and disabling the circuit permanently until corrective actions can be taken. For example, the method may be run multiple times in order to confirm the presence of an over-current or over-temperature condition before taking appropriate actions, and thus may improve power quality and availability by reducing nuisance tripping events. The method may also employ filtering techniques to further reduce erroneous false-positive fault indications. Additionally, the method allows for uninterrupted electrical load operation in the event that a false-positive fault is indicated, but not confirmed.

Figure 5:
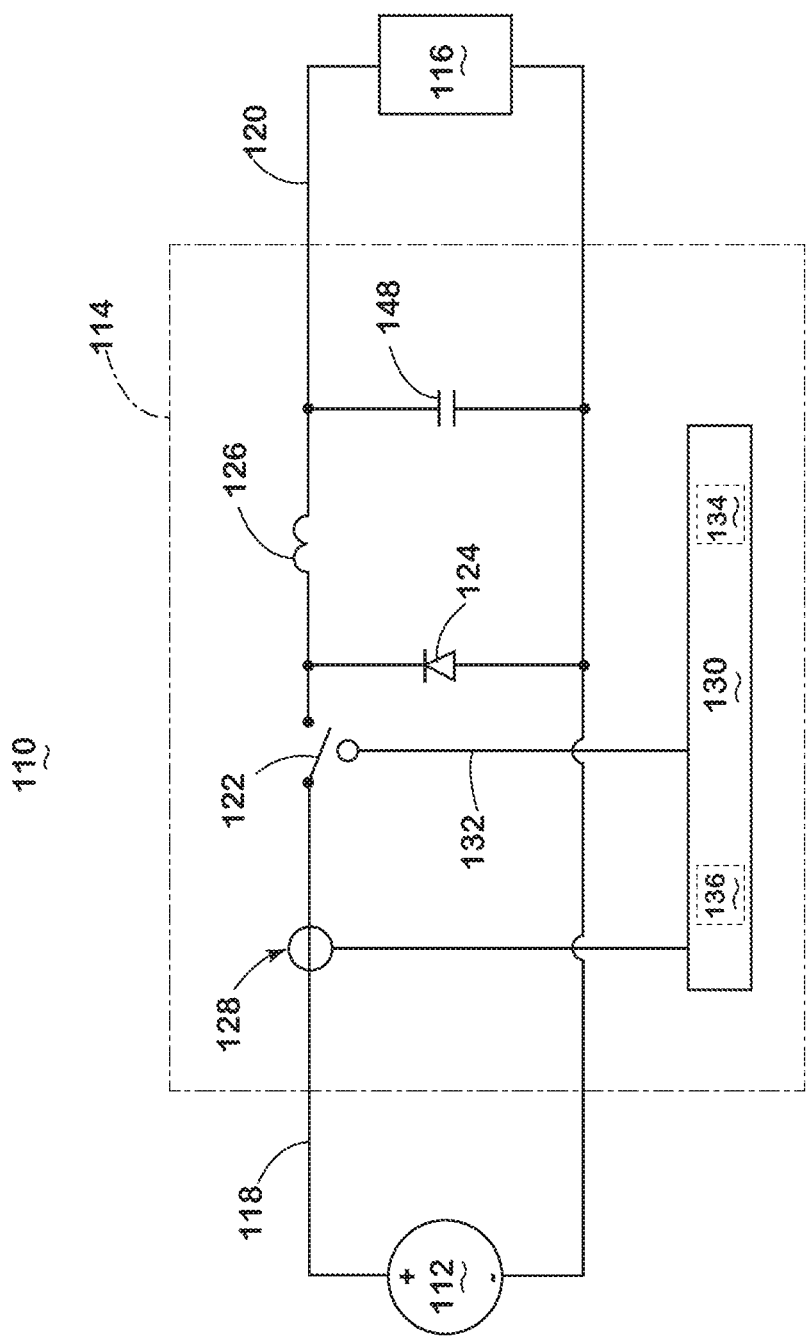
FIG. 5 is a schematic circuit diagram of a power distribution system in accordance with one embodiment.

FIG. 5 illustrates an exemplary schematic circuit diagram of a power distribution system 110, such as an exemplary power distribution system in an aircraft, including a power source, for example, a generator 112, an electrical switch, such as a solid state power switch (SSPC) 114, and an electrical load 116. As shown, the power distribution system 110 further includes electrical interconnects, cables, cable junctions, or bus bars, illustrated as a first electrical transmission wire 118 electrically coupling the generator 112 with the SSPC 114, and a second electrical transmission wire 120 electrically coupling the SSPC 114 with the electrical load 116.

The SSPC 114 may include a controllable switching component 122, and a diode, such as a flywheel diode 124, biased from, for example, electrical ground to the power line, downstream from the switching component 122. As shown, the SSPC 114 may include additional electrical components, for example, an inductance 126 downstream from the switching component 122 and a capacitance 148 configured downstream from the switching component 122 and across the second transmission wire 120 output. The SSPC 114 may further include a current sensor 128 positioned upstream from the switching component 122, and capable of sensing and/or measuring the electrical current characteristics of the current flowing through the power distribution system 110 and/or the current demand characteristics of the system 110. While the current sensor 128 is shown positioned upstream from the switching component 122, the sensor 128 is capable of performing the same or similar functionality at other locations in the power distribution system 110, and thus the illustrated location is merely one non-limiting example of sensor 128 placement. Alternatively, the current sensor 128 may be located downstream from the switching component 122, or on either transmission wire 118, 120. Additional current sensor 128 locations are possible.

One example of the SSPC 114 may include a silicon carbide (SiC) or Gallium Nitride (GaN) based, high bandwidth power switch. SiC or GaN may be selected based on their solid state material construction, their ability to handle large power levels in smaller and lighter form factors, and their high speed switching ability to perform electrical operations very quickly. For example, one non-limiting example of an SSPC may be able to handle 110 Amps and high speed switching such as 1 MHz. Alternative SSPC 114 examples are possible. Another example of the SSPC 114 may include further silicon-based power switch, also capable of high speed switching. In yet another example, the SSPC 114 may also provide power conversion capabilities for the power distribution system 110. For example, the generator 112 may supply power at 28 VDC, which the SSPC 114 may convert to 270 VDC for powering the electrical load 116.

In an embodiment, the switching component 122 is controllable to operate in an open (non-conducting) state that prevents electrical transmission from the generator 112 to the electrical load, and a closed (conducting) state that allows electrical transmission from the generator 112 to the electrical load 116. The flywheel diode 124, the inductance 126, and the capacitance 148 may each be selected or chosen based on electrical characteristics to provide for transient energy protection, as well as electrical energy storage and filtering means, generated during the toggling between the first and second states of the switching component 122. For example, the components 124, 126, 148 may be selected to account for known or unknown transmission line 120 or load 116 electrical characteristics, and, for instance, limit the rate of increase of current flow during the switching to a conductive state of the switching component 122, and/or maintain the voltage to the load 116 during the switching to a non-conductive state of the switching component 122. These selectable components 124, 126, 148, may further, for example, limit electromagnetic interference generated by the system 110 to predetermined or acceptable levels. The switching component 122 of the SSPC 114 may include a field-effect transistor (FET); however, alternative switching components 122 are also possible.

Example current characteristics measurable by the current sensor 128 may include, but are not limited to, instantaneous current, average current, rate of change in current, or the current demand of the electrical load 116. While the current sensor 128 is illustrated measuring the current characteristics at the SSPC 114, other measurement locations are possible. While the current sensor 128 is described as "sensing" and/or "measuring" the electrical current of the power distribution system 110, it is possible that sensing and/or measuring may include the determination of a value indicative or related to the electrical current characteristics, and not the actual current values.

The SSPC 114 may further include a controller 130 having an input to receive the sensed current measurement from the current sensor 128, and capable of generating and providing a control signal 132 output to the switching component 122. In an embodiment, the control signal 132 is capable of controlling the switching component 122, and thus, controlling the operation of the SSPC 114. In an embodiment, the controller 130 may include any components capable of receiving the sensed current measurement and capable of generating and providing a control signal 132, and may include any number of digital processors or analogue circuits capable of functioning and/or controlling as described herein. As shown, the controller 130 may further include memory 134 and a current profile 136.

The memory 134 may include random access memory (RAM), read-only memory (ROM), flash memory, or one or more different types of portable electronic memory, such as discs, DVDs, CD-ROMs, etc., or any suitable combination of these types of memory. The controller 130 may be operably coupled with the memory 134 such that one of the controller 130 and the memory 134 may include all or a portion of a computer program having an executable instruction set for controlling the operation of the SSPC 114 and/or switching component. The program may include a computer program product that may include machine-readable media for carrying or having machine-executable instructions or data structures stored thereon. Such machine-readable media may be any available media, which can be accessed by a general purpose or special purpose computer or other machine with a processor. Generally, such a computer program may include routines, programs, objects, components, data structures, algorithms, etc. that have the technical effect of performing particular tasks or implement particular abstract data types. Machine-executable instructions, associated data structures, and programs represent examples of program code for executing the exchange of information as disclosed herein. Machine-executable instructions may include, for example, instructions and data, which cause a general purpose computer, special purpose computer, controller 130, or special purpose processing machine to perform a certain function or group of functions.

Additionally, the current profile 136, may include a series of one or more sub-profiles, for example a maximum current profile and/or a transitory current profile, wherein each profile is individually defined by a set of predetermined or dynamic electrical characteristics, electrical limits, and/or algorithms. In one example, the maximum current profile may define a predetermined maximum current value the power distribution system 110 can transmit without electrical failure. In another example, the maximum current profile may define a current value that is indicative of an electrical fault or over-current condition in the system 110. In yet another example, the maximum current profile may define a current value slightly above a predetermined maximum current value the power distribution system 110 can transmit without electrical failure. In another example of a sub-profile, a transitory current profile may define an allowable or maximum change in current for the power distribution system 110, for instance, over a temporal factor, such as a moving period of time or time window of the most recent two seconds. In one non-limiting example, a transitory current profile may provide for limiting the current to ten times the normal expected value for a period of 1 millisecond, then limiting the current to five times the normal expected value for a period of 9 milliseconds. Alternative temporal factors or periods or limitations are possible.

Additionally, the exemplified current profiles 136 defined above are a non-exhaustive list of possible profiles 136, and additional profiles 136 are possible defining particular electrical characteristics. For instance, a plurality of current profiles 136 are possible for different modes of operation that take into account the expected electrical characteristics of a various load operations, such as an electric motor starting, or an initial power up/on phase of a load, or even to take into account known transient electrical characteristics to which the system 110 may be subjected to, such as a lightning strike. Each of these pluralities of current profiles 136 may define a maximum current sub-profile and/or a transient current sub-profile, with each profile 136 or sub-profile only being applicable as needed, according to the present operation of the system 110. In another example, at least one current profile 136 may be based on a predetermined or estimated thermal profile of the SSPC 114 and/or the switching component 122 such that the profile 136 describes possible component 114, 122 failures. In yet another example, at least one current profile 136 may be based on a desire to minimize the generation of electromagnetic interference in the system 110, or a desire to minimize excessive transitory demand on the system 110.

While the controller 130 is illustrated as a subcomponent of the SSPC 114, alternative configurations are possible wherein the controller 130 may provide control of the SSPC 114 from a remote location. For example, one controller 130, provided away from the SSPC 114, may be configured to provide control for one or more SSPCs 114 or sets of SSPCs 114. Furthermore, in some embodiments the memory 134 may be separate from the controller 130, but may be in communication with the controller 130 such that it may be accessed by the controller 130. For example, the suitable controller programs stored in the memory 134 may be updated through the wireless communication link, or from a common memory storage system. Furthermore, while the current profile 136 is shown as a subcomponent of the controller 130, alternative non-limiting configurations are possible, for example, wherein the current profile 136 is stored in the memory 134, or remotely from the controller 130.

During operation, in an aircraft embodiment for example, an operating gas turbine engine may provide mechanical energy to provide a driving force for the generator 112, which outputs electricity in response. The generator 112, in turn, provides the generated power to the SSPC 114 via the first transmission wire 118, which in turn, is controllable by the controller 130 to deliver the power to the electrical loads 116, via the second transmission wire 120. Additional power sources for providing power to the electrical loads 116, such as emergency power sources, ram air turbine systems, starter/generators, or batteries, are possible. It will be understood that while one embodiment is described in an aircraft environment, the disclosure is not so limited and has general application to electrical power systems in non-aircraft applications, such as other mobile applications and non-mobile industrial, commercial, and residential applications.

During operation of the power distribution system 110, unexpectedly high currents travelling through at least one of the transmission wires 118, 120, SSPC 114, and/or switching component 122 may cause system 110 failure or an over-temperature condition in the system 110. One non-limiting example of unexpectedly high currents may be defined by current exceeding a designed operating range by a predetermined factor, such as by ten times the operating range. One non-limiting example of an unexpectedly high current, maximum transmissible current, or "over-current" condition, may be fifteen times the maximum expected current for the system 110. Higher over-current conditions and/or limits are possible. While embodiments may relate to whole system 110 failures, one non-limiting example may expect that a common point of failure due to an over-current condition may occur in or at the FET or switching component 122.

Over-current conditions may occur due to electrical arcing or electrical shorts in an environment where, for example, physical defects in an electrical connection cause a permanent or temporary loss in transmission capabilities, or a sudden transmission of high levels of current. While electrical arcing and/or electrical shorts are described, additional causes of over-current conditions are possible, such as lightning strikes, current rush during starting conditions, etc.

In an embodiment, the controller 130 operates to protect the power distribution system 110 from over-current or over-temperature conditions by using the current profile 136 and applying the profile 136 to control operating characteristics of the power distribution system 110. A method for operating the power distribution system 110 to limit the transmission of current through the system 110 is described herein. First, the current sensor 128 provides a sensing of current along at least one transmission wire 118, 120 of the system 110 under normal operation (i.e. the switching component 122 in a closed state), and this sensing of current is provided to the controller 130. In an embodiment, the current sensor 128 may, for example, provide the sensing of current at timed increments, continuously, or when polled by the controller 130.

The controller 130 then compares the sensing of the current against at least one of the current profiles 136. This comparison may, for example, determine if the sensed current is greater than a maximum current profile for the system 110. Alternatively, the comparison may determine if the sensed current in a particular operating condition of the system 110 (e.g. electric motor starting, initial power up/on phase of a load, lightning strikes, etc.) is greater than the corresponding maximum current profile for that operating condition. In the example of a transitory current profile, the comparison may determine if the change in current, which may be sensed over a time period, exceeds or is greater than at least one transitory current profile. In implementation, the one or more current profiles and/or the characteristics of the current sensor 128 may be converted to an algorithm, which may be converted to a computer program including a set of executable instructions, which may be executed by the controller 130.

The controller 130 then determines how to control the operation of the SSPC 114 based on the aforementioned comparison. For example, the controller 130 may generate a pulse width modulation (PWM) signal, having a duty cycle, such that the controller 130 may control the amount of current transmission through the SSPC 114 according to the duty cycle. As used herein, a "duty cycle" is defined as the percentage of one period in which a signal is active, which, for example, may correspond to operating the SSPC 114 in a first conducting state. Alternative definitions of a "duty cycle" defining operations of the SSPC 114 and/or the switching component 122 are possible.

If the controller 130 generates this PWM signal as the control signal 132, the SSPC 114 will operate by toggling the switching component from the first conducting state to the second non-conducting state repeatedly, according to the duty cycle, such that the average current flow and/or the power transmission of the SSPC 114 along the transmission wires 118, 120 may be proportional to the control signal 132 (i.e. the PWM duty cycle signal). One non-limiting example of a proportional duty cycle response may include wherein average current flow of ninety percent of the previous current flow or current demanded by the electrical load 116 in response to a ninety percent duty cycle signal. Alternative proportional responses are possible, and embodiments are not limited to a one-to-one proportional response between the average current and duty cycle signal.

In this example, the switching component 122 is capable of switching operations faster than the PWM duty cycle of the control signal 132, such that the speed switching component 122 is not a limiting factor. However, alternative embodiments are possible wherein the control signal 132, duty cycle signal, or operation of the SSPC 114 is limited by the switching speed of the switching component 122.

As described, the controller 130 may determine a PWM duty cycle for operating the SSPC 114 in the first conducting state and the second non-conducting state based on the comparison of the sensed current with the current profile. The controller 130 then generates the PWM duty cycle signal as the control signal 132, which is provided to control the switching component 122 of the SSPC 114. Thus, the SSPC 114 is operated according to the PWM duty cycle signal.

Thus, according to the aforementioned method, in an electrical circumstance wherein the sensed current satisfies a comparison with a current profile 136 or sub-profile, the controller 130 may control the SSPC 114 to, for example, reduce the duty cycle signal in order to reduce the current transmission along the transmission wires 118, 120 to a value less than, for instance, the maximum current profile. Likewise, the controller 130 may determine a reduced duty cycle is warranted when a comparison of the sensed current with a transitory current profile indicates the current demand is changing too rapidly, for instance, according to the previously described thermal profile, or according to a desire to minimize the generation of electromagnetic interference or minimizing excessive transitory demand. In this example, the controller 130 may determine a reduced duty cycle, such that the average power along the transmission wires 118, 120 is reduced to less than the transitory current profile.

Additionally, in instances where the sensed current is indicative of an electrical fault, the controller 130 may operate the SSPC 114 with a duty cycle of zero percent, which correspondingly holds the switching component 122 in the second non-conducting state, and thus permanently or temporarily disables the power distribution system 110 until the failure can be addressed, for example, by maintenance personnel. Likewise, where the comparison of the sensed current does not satisfy any current profile (which may be indicative of no unexpected electrical characteristics), the SSPC 114 may be operated with a duty cycle signal of one hundred percent, holding the switching component 122 in the first conducting state.

In an embodiment, the above-mentioned steps may occur continuously or intermittently, and may be repeated indefinitely, or cease after a predetermined number of repetitions, for example.

While only a single generator 112, SSPC 114, first transmission wire 118, second transmission wire 120, electrical load 116, and controller 130 are illustrated for ease of understanding, alternate power distribution systems 110 are possible having one or more of the aforementioned components 112, 114, 116, 118, 130 configured to define a robust power distribution system 110, or network of systems 110. For example, alternative configurations are possible having more than one electrical load 116 coupled to each SSPC 114, more than one set of transmission wires 118, 120 configured in series or parallel, or more than one SSPC 114 configured to selectively couple multiple sets of transmission wires 118 to additional portions of the power distribution system 110. Additionally, embodiments are possible wherein, for example, one controller 130 remotely controls operation of a plurality of SSPCs 114.

Figure 6:
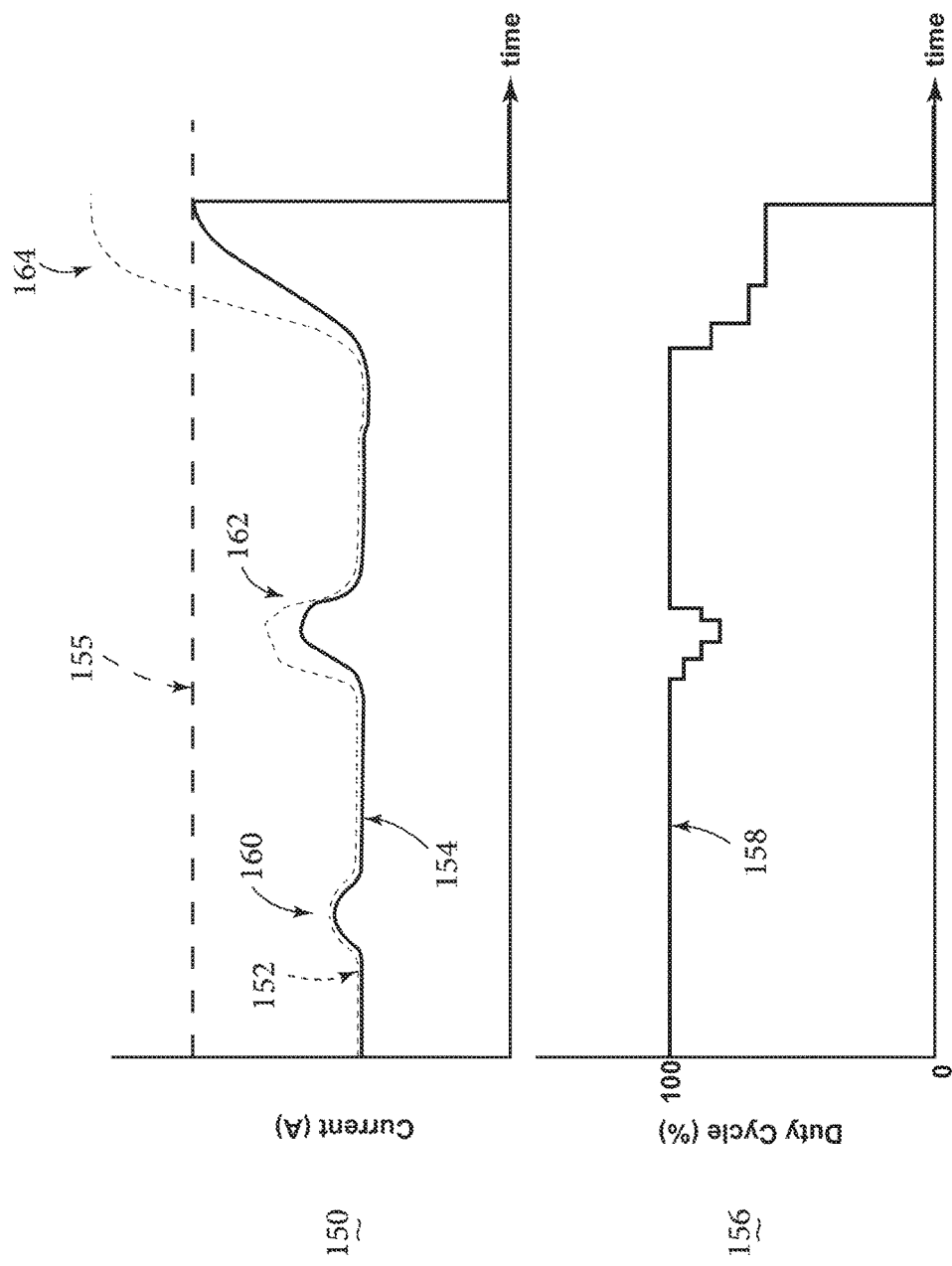
FIG. 6 is a series of graphs showing the response of the power distribution system, in accordance with the embodiment of FIG. 5.

One embodiment of the power distribution system 110 operation may be further understood with reference to the time-aligned graphs presented in FIG. 6. As illustrated, a first graph 150 shows an example current demand signal (shown as a dotted line 152) and a corresponding system current signal 154, for example, as measured by the current sensor 128. The first graph 150 further indicates a maximum current profile 155 current value, which may indicate an electrical fault. Also illustrated, a second graph 156 shows a duty cycle signal 158, wherein the first and second graphs 150, 156 are time-aligned. In an example first transient demand 160, such as turning on a small light bulb, the current demand signal 152 rises slightly while the system current 154 is operating at one hundred percent duty cycle. In an embodiment, the comparison of the sensed current with the current profile 136 will determine that no change is needed to account for the small first transient demand 160, and thus the system 110 is capable of keeping the duty cycle signal at one hundred percent and provides sufficient system current 154 to account for the current demand 152.

In an example second transient demand 162, such as starting an electric motor, the current demand signal 152 rises sharply, but levels off. In this second transient demand 162, a comparison of the sensed current with the current profile 136 may determine the sensed current exceeds a transitory current profile, indicating the change in current is too great. In this example, the duty cycle signal 158 may be reduced, for example, in a step down sequence, to limit the amount of power transmitted on the transmission wires 118, 120 to prevent an over-current condition in the system 110. Once the second transient demand 162 has passed, a further comparison of the sensed current may no longer exceed the transitory current profile, and the controller 130 may determine an increase in the duty cycle signal 158 can be achieved.

In an example third transient demand 164, such as an electrical fault or short in the transmission wire 120, the current demand raises very sharply, raising the current demand signal 152 beyond the maximum current profile 155. As shown, at first the system current signal 154 attempts to match the rise in current demand signal 152, along with a corresponding reduction in duty cycle signal 158, however, when the system current signal 154 reaches the maximum current profile 155 limit. In an embodiment, the comparison of the sensed current with the maximum current profile indicates an electrical fault, and thus, the controller 130 determines the duty cycle signal 158 should be set to zero percent, and correspondingly the switching component 122 is held in the second non-conducting state, dropping the system current signal to zero.

The first and second graphs 150, 156 are intended to be simplistic illustrations of an operation of one embodiment, and are not intended to accurately represent exact electrical responses in a system 110. Alternative system 110 responses are possible wherein, for example, the duty cycle signal 158 response may be linear.

In an embodiment, a system includes a power source, and a solid state power controller (SSPC) configured to operate in a first conducting state and a second non-conducting state. The SSPC is electrically coupled with the power source and is also electrically coupled with an electrical load via a transmission wire. The system additionally includes a controller. The controller is configured (e.g., by way of non-transiently stored program instructions in memory) to sense a current along the transmission wire, to compare the sensing of the current to a current profile, to determine a pulse width modulation (PWM) duty cycle for operating the SSPC in the first state and second state based on the comparing, and to operate the SSPC according to the duty cycle.

Many other possible embodiments and configurations in addition to that shown in the above figures are discussed in the present disclosure. For example, in an embodiment, the flywheel diode 124 may be replaced by a second switching component, which may be controllable by the controller 130 or another device, to reduce power losses during operation. Furthermore, while the SSPC 114 is illustrated as connected directly between the generator 112 and load 116, embodiments are possible wherein the SSPC 114 is one of hundreds or thousands of SSPCs 114 which may be directly connected to one or more generators 112, or which may be connected in a hierarchical chain of 'primary' controls coupled with the one or more generators 112, and providing power through a network of chained SSPCs 114, relays, contactors, circuit breakers, etc., such that the SSPC 114 may drive one or more loads 116, directly or indirectly. Additionally, the design and placement of the various components may be rearranged such that a number of different in-line configurations could be realized.

The embodiments disclosed herein provide a method for limiting or interrupting current in a circuit. The technical effect is that the above described embodiments enable the limiting of current in the circuit to prevent or reduce over-current and/or over-temperature conditions. One aspect that may be realized in the above embodiments is that the above described embodiments provide for reducing system current in response to an over-current condition, which may limit the over-current condition to a limited time. Over-current conditions may be indicative of a parallel or arcing fault in the system, which may generate intense localized heat from resistive losses at the fault, which could further lead to an electrical fire, smoke, melting of or damage to components, or catastrophic failures of the electrical system or greater structure, such as an aircraft. Thus, by limiting the current in the system, and correspondingly, limiting the time the system operating in an over-current condition, the likelihood of thermal runaway due to a fault is reduced.

Another aspect of the above-described embodiments is the method allows for detection and prevention of an over-temperature condition at the switching component of the SSPC, which is likely to be a point of thermal failure during an over-current or over-temperature condition. The method thus allows for increased protection of the switching component and SSPC due to the current limiting technique described above. Furthermore, the above-described method may be applied to a plurality of SSPCs to ensure thermal failure protection across each of the SSPCs, or if failure occurs, further protection from thermal damage, electrical fire, smoke, etc. due to the disabling of the SSPC.

Yet another aspect of the above-described embodiments is that the method allows for temporal transitory currents in excess of normal operating conditions to reduce and/or eliminate "nuisance tripping" events, such as starting an electric motor or lightning strike, which may otherwise trigger system disabling. Thus the method improves power quality by continuing to operate through nuisance tripping events. The method may also employ filtering techniques to further reduce erroneous false-positive fault indications.

Even yet another aspect of the above-described embodiments is that the method allows for the control of current in the system while limiting the electromagnetic interference and/or excessive transitory demands, each of which may affect coupled or adjacent electrical systems. Furthermore, by instituting the above-described methodology, the SSPC may be capable of controlling the current flow with a much lower average power dissipation (for example, via lower, predictable thermal losses), such that SSPC components may be designed and/or selected with more accurate tolerances and less robust heat and/or stress dissipation characteristics. Additionally, the above-described system provides for controllable operation of a switch with minimal voltage drop when in the conducting state and current demand is below the maximum level.

The above-described embodiments, thus, provide for increased safety for an aircraft electrical power distribution system and hence improve the overall safety of the aircraft and air travel. Furthermore, by disabling the electrical circuits in the event of over-current and/or over-temperature conditions (repeated or otherwise), this reduces or eliminates any additional maintenance time and/or costs associated with having to replace electrical components damaged or destroyed due to the over-current and/or over-temperature fault, as well as reduces or eliminates additional maintenance time and/or costs associated with diagnosis of nuisance tripping events.

This written description uses examples to disclose the embodiments, including the best mode, and also to enable any person skilled in the art to practice the embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for limiting current in a circuit having a power source electrically coupled with a solid state power controller (SSPC), the SSPC configured to operate in a first conducting state and a second non-conducting state and further coupled with an electrical load via a transmission wire having an inductance, and a flywheel diode configured across the transmission wire, the method comprising:
   a) a first sensing of a current along the transmission wire while the SSPC is operated in the first conducting state;
   b) determining when the first sensing of the current satisfies a first current threshold;
   c) reducing a power transmission along the transmission wire by operating the SSPC in the second non-conducting state and allowing electrical energy stored in the inductance to generate current through the flywheel diode;
   d) a second sensing of a current along the transmission wire;
   e) determining if the second sensing of the current satisfies a second current threshold; and
   f) increasing the power transmission along the transmission wire by operating the SSPC in the first conducting state.

2. The method of claim 1, wherein determining if the first sensing of the current satisfies a first current threshold comprises comparing the first sensed current with the first current threshold and wherein determining if the second sensing of the current satisfies a second current threshold comprises comparing the second sensed current with the second current threshold.

3. The method of claim 2, wherein determining if the first sensing of the current satisfies a first current threshold comprises determining if the first sensing of the current is greater than the first current threshold and wherein determining if the second sensing of the current satisfies a second current threshold comprises determining if the sensed current is less than the second current threshold.

4. The method of claim 1, wherein determining if the first sensing of the current satisfies a first current threshold further comprises determining if an over-current condition exists.

5. The method of claim 1, wherein determining if the first sensing of the current satisfies a first current threshold further comprises determining if an over-temperature condition exists.

6. The method of claim 5, wherein the over-temperature condition is defined by a SSPC thermal profile.

7. The method of claim 1, further comprising selecting the inductance based on a desired power transmission response during reducing the power transmission.

8. The method of claim 1, wherein determining if the first sensing of the current satisfies a first current threshold further comprises a first comparing of the first sensing of the current to a SSPC thermal profile.

9. The method of claim 1, further comprising repeating a)-f).

10. The method of claim 9, further comprising counting a number of repetitions of a)-f).

11. The method of claim 10, further comprising disabling the circuit upon a determination that the number of repetitions satisfies a predetermined number.

12. The method of claim 11, wherein disabling the circuit further comprises at least one of temporarily or permanently disabling the circuit.

13. The method of claim 10, wherein counting the number of repetitions further comprises counting the number of repetitions of a)-f) in a moving time window.

14. The method of claim 13, further comprising disabling the circuit upon a determination that the number of repetitions in a moving time window satisfies a system failure threshold.

15. The method of claim 14, wherein disabling the circuit further comprises at least one of temporarily or permanently disabling the circuit.

16. The method of claim 11, wherein counting the number of repetitions further comprises counting the number of repetitions of a)-f) in a moving time window.

17. The method of claim 12, wherein counting the number of repetitions further comprises counting the number of repetitions of a)-f) in a moving time window.

18. A system comprising:
   a power source;
   a solid state power controller (SSPC) configured to operate in a first conducting state and a second non-conducting state, wherein the SSPC is electrically coupled with the power source and wherein the SSPC is also electrically coupled with an electrical load via a transmission wire having an inductance;
   a flywheel diode coupled across the transmission wire; and
   a controller, wherein the controller is configured to:
   determine when a first sensing of a current along the transmission wire, while the SSPC is operated in the first conducting state, satisfies a first current threshold;
   reduce a power transmission along the transmission wire by operating the SSPC in the second non-conducting state and allowing electrical energy stored in the inductance to generate current through the flywheel diode;
   determine if a second sensing of a current along the transmission wire satisfies a second current threshold; and increase the power transmission along the transmission wire by operating the SSPC in the first conducting state.

* * * * *